United States Patent
Nam

(10) Patent No.: US 7,440,352 B2
(45) Date of Patent: Oct. 21, 2008

(54) SEMICONDUCTOR MEMORY DEVICE CAPABLE OF SELECTIVELY REFRESHING WORD LINES

(75) Inventor: Kyung-woo Nam, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 60 days.

(21) Appl. No.: 11/339,734

(22) Filed: Jan. 26, 2006

(65) Prior Publication Data

US 2006/0171241 A1    Aug. 3, 2006

(30) Foreign Application Priority Data

Jan. 28, 2005    (KR) .................... 10-2005-0008119

(51) Int. Cl.
*G11C 7/00*    (2006.01)
(52) U.S. Cl. .................. 365/222; 365/227; 365/228
(58) Field of Classification Search .................. 365/222, 365/226, 227
See application file for complete search history.

(56) References Cited

U.S. PATENT DOCUMENTS

| | | | | |
|---|---|---|---|---|
| 4,947,379 A | * | 8/1990 | Okuyama ................. | 365/233.5 |
| 6,381,188 B1 | * | 4/2002 | Choi et al. ................ | 365/222 |
| 6,490,216 B1 | | 12/2002 | Chen et al. | |
| 6,515,929 B1 | * | 2/2003 | Ting et al. ................ | 365/222 |
| 6,862,238 B1 | * | 3/2005 | Lee .......................... | 365/222 |
| 6,876,593 B2 | * | 4/2005 | Shi et al. .................. | 365/222 |
| 6,934,211 B2 | * | 8/2005 | Hazama et al. ............ | 365/222 |
| 6,956,782 B2 | * | 10/2005 | Hoehler .................... | 365/222 |
| 6,982,917 B2 | * | 1/2006 | Lee et al. .................. | 365/222 |
| 6,992,943 B2 | * | 1/2006 | Hwang et al. ............. | 365/222 |

FOREIGN PATENT DOCUMENTS

| | | |
|---|---|---|
| JP | 10255468 | 9/1998 |
| JP | 2001093278 | 4/2001 |
| KR | 1020030016530 | 3/2003 |
| KR | 1020030054886 | 7/2003 |

* cited by examiner

*Primary Examiner*—Huan Hoang
*Assistant Examiner*—Michael J Weinberg
(74) *Attorney, Agent, or Firm*—Volentine & Whitt, PLLC

(57) ABSTRACT

A semiconductor memory device comprises a plurality of memory cells connected to a plurality of word lines grouped in word line sets. Each of the word line sets is connected to a word line enable signal generation unit which stores information indicating whether data has been written to any of the memory cells connected to the word line set. The word line enable signal generation unit controls refresh operations for memory cells connected to the word line set so that only word lines connected to memory cells that have been programmed are refreshed.

9 Claims, 8 Drawing Sheets

Number of refresh operations: 3

Number of refresh operations: 7

US 7,440,352 B2

SEMICONDUCTOR MEMORY DEVICE CAPABLE OF SELECTIVELY REFRESHING WORD LINES

BACKGROUND OF THE INVENTION

1. Field of the Invention

Embodiments of the present invention relate generally to a semiconductor memory device. More particularly, embodiments of the invention relate to a semiconductor memory device capable of selectively refreshing word lines included therein.

A claim of priority is made to Korean Patent Application No. 10-2005-0008119, filed on Jan. 28, 2005, the disclosure of which is hereby incorporated by reference in its entirety.

2. Description of Related Art

A conventional Dynamic Random Access Memory (DRAM) comprises a plurality of DRAM memory cells, each comprising a single transistor and a single capacitor. A DRAM memory cell stores data by charging the capacitor and it reads data by detecting the amount of charge on the capacitor, i.e., the capacitor's voltage. Where the amount of charge on the capacitor exceeds a predetermined threshold value, the DRAM cell stores a first logic state (e.g., logical '1'). On the other hand, where the amount of charge on the capacitor is below the threshold value, the DRAM cell stores a second logic state (e.g., logical '0').

Unfortunately, the charge stored in the capacitor tends to decay over time. Accordingly, DRAM memory cells need to be periodically refreshed to maintain their stored data values. If a DRAM memory cell is not periodically refreshed, for example, if the DRAM's power supply is disconnected, the DRAM memory cell loses its stored data.

One problem with the conventional techniques for refreshing DRAM memory cells is that the conventional techniques refresh memory cells regardless of whether they store any charge. For instance, where all of the DRAM memory cells connected to a word line store the second logic state, conventional techniques still perform a refresh operation on those DRAM memory cells. Since the refresh operation takes time and consumes power, performing unnecessary refresh operations can impair a DRAM's performance.

SUMMARY OF THE INVENTION

According to one embodiment of the present invention, a semiconductor memory device comprises a memory cell array comprising a plurality of memory cells connected to a plurality of word lines and bit lines arranged in a matrix. The plurality of word lines are grouped in a plurality of word line sets, where each word line set includes at least one word line. The semiconductor memory device further comprises a word line enable signal generation unit adapted to generate a word line enable signal to prevent memory cells connected to word lines in a first word line set from being refreshed when a power-up signal is activated or when no memory cells connected to the first word line set stores any data, and a word line driver adapted to receive the word line enable signal to selectively refresh the memory cells connected to the first word line set to be selectively refreshed.

According to another embodiment of the present invention, a semiconductor memory device comprises a plurality of banks, each comprising a plurality of memory cells arranged in a matrix defined by a plurality of word lines and bit lines. The word lines are divided into a plurality of word line sets and each word line set comprises at least one word line. The semiconductor memory device further comprises a word line enable signal generation unit controlling a logic level of a word line enable signal to prevent a first bank from being refreshed when inactivated while allowing the first bank to be refreshed when activated, wherein the logic level of the word line enable signal depends on whether data has been written any memory cells in the first bank, and a word line driver adapted to receive the word line enable signal and allow a corresponding word line set to be selectively refreshed.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

According to selected embodiments of the present invention, a semiconductor memory device comprises a plurality of memory cells arranged in a matrix defined by a plurality of word lines and bit lines. The plurality of word lines forms one or more blocks, and each block is divided into one or more word line sets, where each of the word line sets comprises a plurality of word lines.

For example, in one embodiment, the semiconductor memory device comprises a plurality of memory cells connected to 256 word lines WL. The 256 word lines WL are divided into four blocks with 64 word lines in each block, and each block is divided into 16 word line sets with four word lines each. In addition, each word line set is connected to a latch unit. The 256 word lines WL can be accessed using an eight (8) bit address A[7:0]. For example, bits A7 and A6 could be used to distinguish between the four blocks, bits A5, A4, A3, and A2 could be used to distinguish between the sixteen (16) word line sets, or latch units, and bits A1 and A0 could be used to distinguish between the individual word lines in each word line set.

Figure 1:
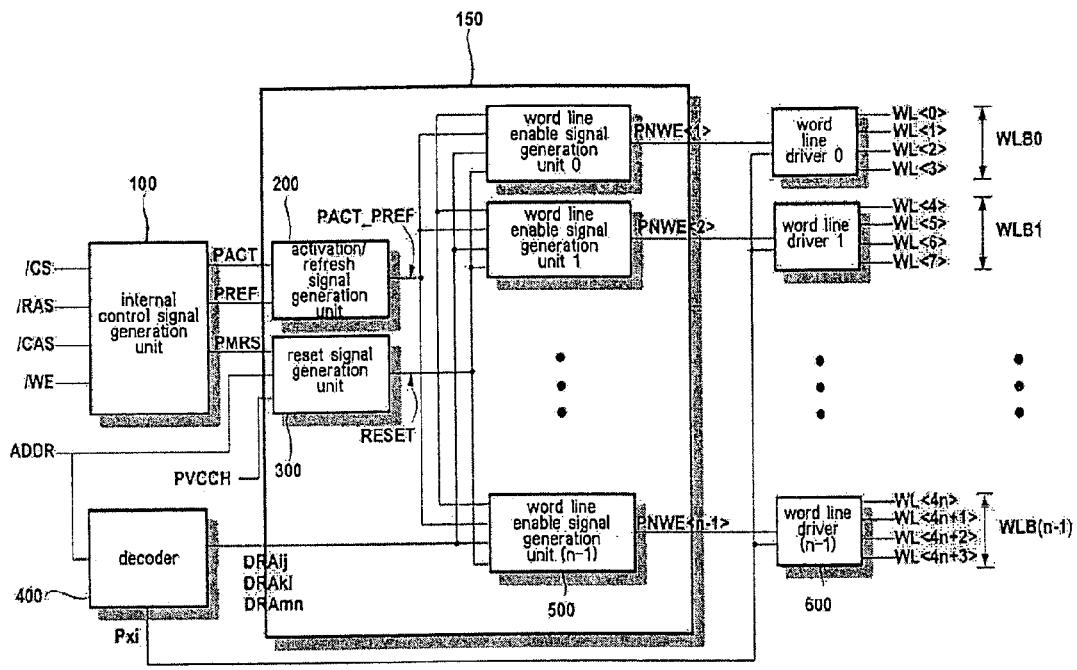
FIG. 1 is a block diagram of a semiconductor memory device according to one embodiment of the present invention.
Figure 2:
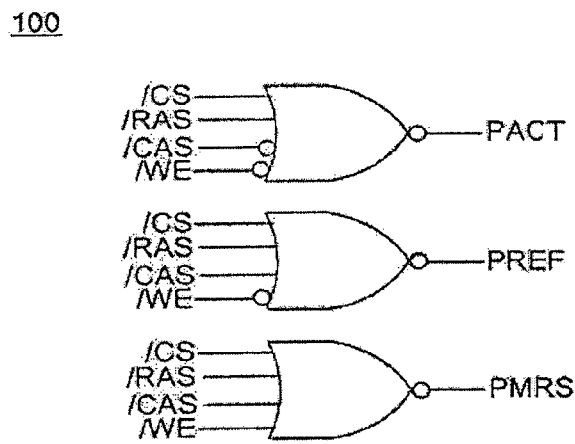
FIG. 2 is a circuit diagram of an internal control signal generation unit shown in FIG. 1.
Figure 3:
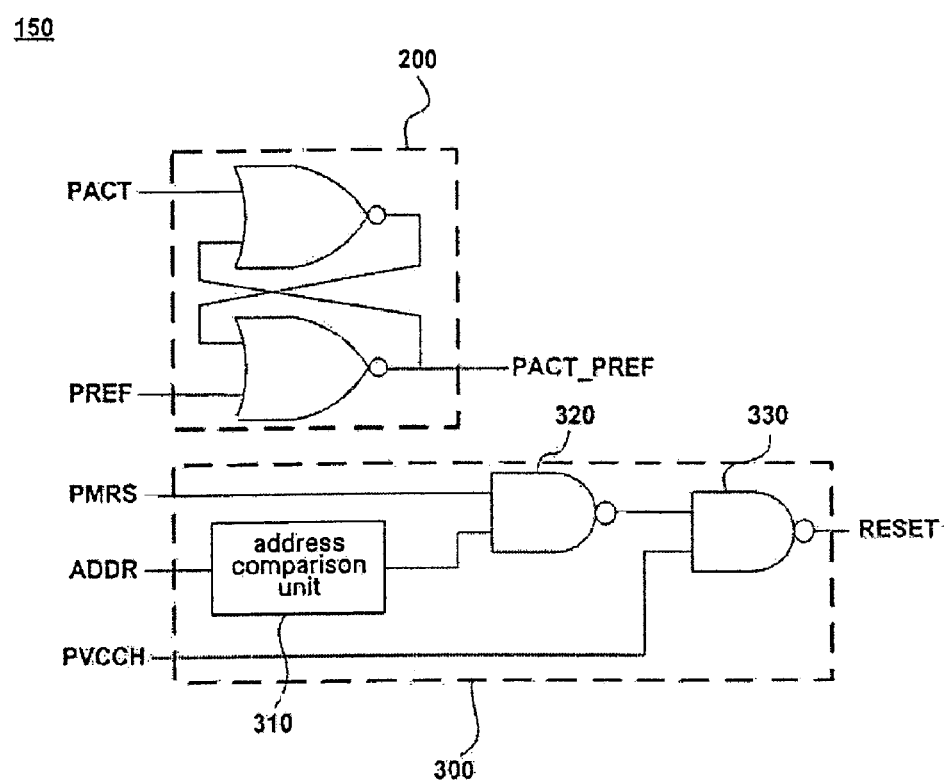
FIG. 3 is a circuit diagram of an activation/refresh signal generation unit and a reset signal generation unit shown in FIG. 1.

Selected embodiments of a semiconductor memory device capable of selectively refreshing a plurality of word lines are described below in relation to FIGS. 1 through 4. In particular, FIG. 1 is a block diagram of a semiconductor memory device according to one embodiment of the present invention; FIG. 2 is an exemplary circuit diagram of an internal control generation unit shown in FIG. 1; FIG. 3 is an exemplary circuit diagram of an activation/refresh signal generation unit and a reset signal generation unit shown in FIG. 1; and, FIG.

4 is an exemplary circuit diagram of a word line enable signal generation unit and a word line driver shown in FIG. 1.

Referring to FIG. 1, a semiconductor memory device comprises an internal control signal generation unit 100, a refresh control unit 150, a decoder 400, and a plurality of word line drivers 600, denoted word line driver 0 through word line driver "n-1".

Refresh control unit 150 comprises an activation/refresh signal generation unit 200, a reset signal generation unit 300, and a plurality of word line enable signal generation units 500, denoted word line enable signal generation unit 0 through word line enable signal generation unit "n-1".

Word line enable signal generation units 0 through "n-1" are respectively connected to word line drivers 0 through "n-1" via respective signal lines providing word line enable signals PNWE<0> through PNWE<n-1>. In addition, word line drivers 0 through "n-1" are respectively connected to word line sets WS<0> through WS<n-1>. Each of word line sets WS<0> through WS<n-1> comprises four (4) word lines, making a total of 4n word lines. In FIG. 1, each word line set constitutes a word line block. Accordingly, word line sets WS<0> through WS<n-1> respectively correspond to word line blocks WLB0 through WLB(n-1).

Internal control signal generation unit 100 receives a chip selection signal /CS, a row address strobe signal /RAS, a column address strobe signal /CAS and a write enable signal /WE, and outputs an activation command signal PACT, a refresh command signal PREF and a mode register set (MRS) signal PMRS.

Activation command signal PACT is used to activate (i.e., set to a logic level "high") one of word line sets WS<0> through WS<n-1>, and refresh command signal PREF is used to refresh one of word line sets WS<0> through WS<n-1>. Meanwhile, MRS signal PMRS is used to control a range of word line sets WS<0> through WS<n-1> that can be refreshed. In other words, MRS signal PMRS specifies a subset of word line sets WS<0> through WS<n-1> (or word line banks WLB0 through WLB(n-1)) that can be refreshed, e.g., half of those on a chip. Accordingly, MRS signal PMRS is referred to as a partial array self refresh (PASR) signal. An address signal ADDR identifies the word line set WS<i> to be refreshed in a particular refresh operation. In this written description, it will be assumed that address ADDR corresponds to eight bit address A[7:0].

Where MRS signal PMRS is activated, the semiconductor memory is said to operate in a "MRS mode". For example, the MRS mode can be a PASR HALF MRS mode in which only half of word line banks WLB0 through WLB(n-1) can be refreshed. Alternatively, the MRS mode can be a PASR FULL MRS mode, where all of word line banks WLB0 through WLB(n-1) can be refreshed.

Referring to FIG. 2, internal control signal generation unit 100 comprises first through third NOR gates. The first NOR gate receives chip selection signal /CS, row address strobe signal /RAS, inverted column address strobe signal /CAS and inverted write enable signal /WE and outputs activation command signal PACT. The second NOR gate receives chip selection signal /CS, row address strobe signal /RAS, column address strobe signal /CAS and inverted write enable signal /WE and outputs refresh command signal PREF. The third NOR gate receives chip selection signal /CS, row address strobe signal /RAS, column address strobe signal /CAS and write enable signal /WE and outputs MRS signal PMRS.

Figure 4:
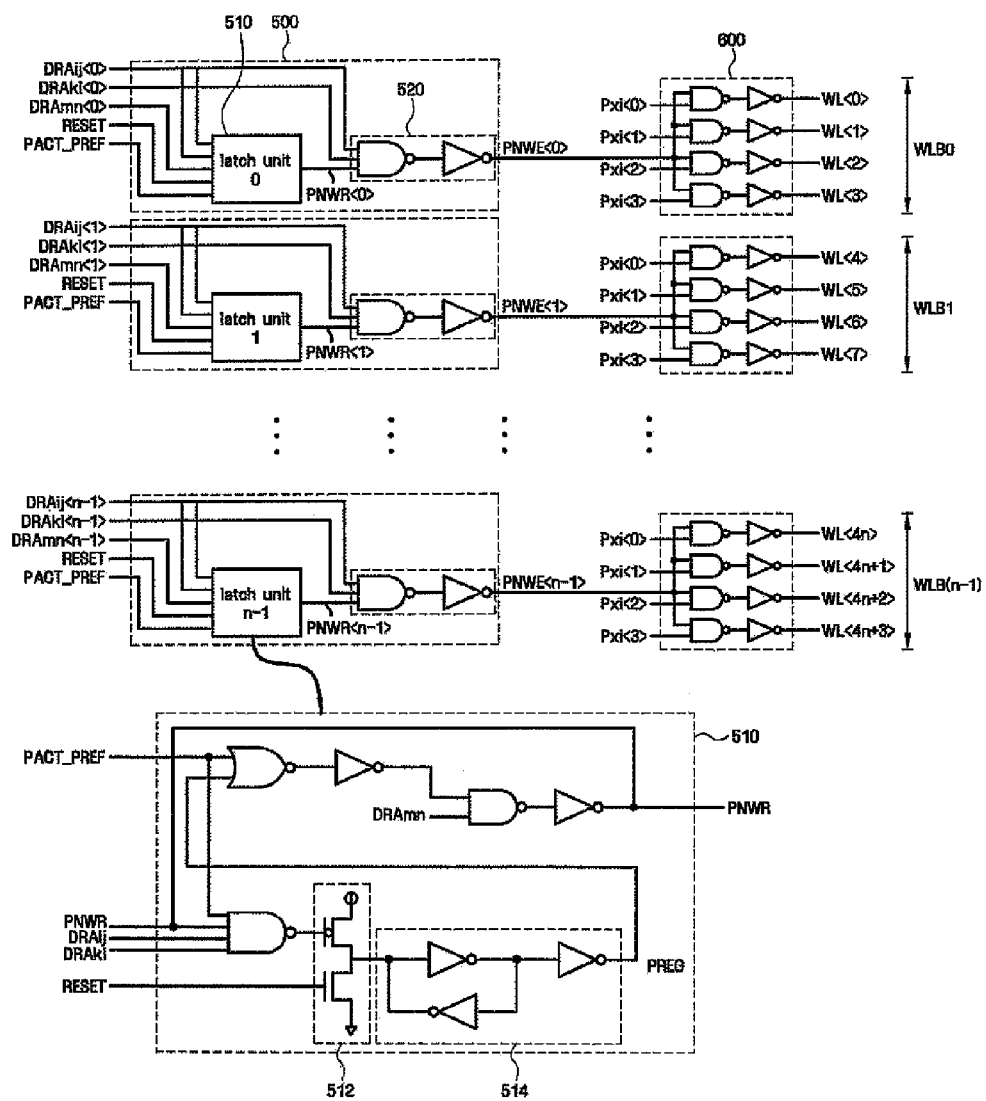
FIG. 4 is a circuit diagram of word line enable signal generation units and word line drivers shown in FIG. 1.

Referring to FIGS. 1, 3 and 4, refresh control unit 150 comprises an activation/refresh signal generation unit 200, a reset signal generation unit 300 and a plurality of word line enable signal generation units 500.

Activation/refresh signal generation unit 200 comprises a NOR latch. Activation/refresh signal generation unit 200 receives activation command signal PACT and refresh command signal PREF and generates an activation/refresh signal PACT_PREF. Upon receiving activation command signal PACT, activation/refresh signal generation unit 200 generates activation/refresh signal PACT_PREF with a logic level "high". Upon receiving refresh command signal PREF, activation/refresh signal generation unit 200 generates activation/refresh signal PACT_PREF with a logic level "low".

Reset signal generation unit 300 comprises an address comparison unit 310 and first and second NAND gates 320 and 330. Address comparison unit 310 receives address ADDR and outputs an address comparison output signal. First NAND gate 320 receives the address comparison output signal and mode register set signal PMRS and outputs a first NAND output signal. Second NAND gate 330 receives the first NAND output signal and a power-up signal PVCCH and outputs a reset signal RESET. Power-up signal PVCCH is activated when the semiconductor memory device is powered-up. Assuming that the semiconductor memory device is volatile, power-up signal PVCCH indicates that none of the memory cells in the semiconductor memory device store any data.

Address comparison unit 310 determines whether or not address ADDR corresponds to a bank whose memory cells store data. Where address ADDR corresponds to a bank whose memory cells do not store any data, address comparison unit 310 generates the address comparison output signal with logic level "high". As a result, where the semiconductor memory device is in the MRS mode and power-up signal PVCCH has logic level "high", reset signal generation unit 300 generates reset signal RESET with logic level "high".

Reset signal RESET serves at least two purposes. First, it prevents a refresh operation from being performed on corresponding word line sets when the semiconductor memory device is powered up because when power is first applied to the semiconductor memory device, memory cells in the semiconductor memory device do not store any data.

Second, reset signal RESET prevents refresh operations from being performed on certain banks while the semiconductor memory device is in the MRS mode. In other words, where mode register set signal PMRS indicates PASR HALF MRS mode and address ADDR corresponds to a bank that is not used in this mode, reset signal RESET is activated. Address comparison unit 310 stores bank address information based on the MRS mode and generates reset signal RESET when address ADDR corresponds to the bank address information. As will be described later, reset signal RESET is used to reset a latch, thereby preventing a refresh operation from being performed on a particular word line or word line set.

Referring to FIG. 4, each of the plurality of word line enable signal generation units 500 comprises a latch unit 510 and a comparison unit 520 (also called AND gate 520). Each latch unit 510 receives a decoded row address signal DRAij<i>, a decoded row address signal DRAkl<i>, and a decoded row address signal DRAmn<i>, where "i" ranges from 0 to "n-1", and "n" is the number of word line enable signal generation units 500. Each latch unit 510 also receives reset signal RESET and activation/refresh signal PACT_REF. Latch unit 510 outputs a refresh decision signal PNWR<i>, whose value depends on a data value stored in latch unit 510. Throughout this written description, the index "i" will be used to identify signals and elements associated with a particular word line set which is selected by address ADDR.

The word line enable signal generation unit 500 receives reset signal RESET, activation/refresh signal PACT_REF and refresh decision signal PNWR<i>, and outputs a word line enable signal PNWE<i> to enable a corresponding word line set WS<i>. Where refresh decision signal PNWR<i> has logic level "low", word line enable signal generation unit 500 activates (i.e., sets to logic level "high") word line enable signal PNWE<i>. Word line enable signal generation unit 500 can reset every latch unit 510 by activating reset signal RESET, causing each refresh decision signal PNWR<i> to be deactivated (i.e., set to logic level "low"). Where refresh decision signal PNWR<i> is deactivated, a corresponding word line enable signal PNWE<i> is activated.

Each latch unit 510 typically comprises an inverter 512 and a latch 514. Latch unit 510 receives row address decoding signals DRAij<i>, DRAkl<i>, and DRAmn<i>, reset signal RESET, and activation/refresh signal PACT_PREF, and stores a bit of information in latch 514. Each latch unit 510 outputs refresh decision signal PNWR<i> containing information about whether a refresh operation is necessary for a corresponding word line set WS<i>. Furthermore, the latch unit 510 receives reset signal RESET to prevent a refresh operation from being performed on a corresponding word line set WS<i>.

The operation of latch unit 510 is described in further detail below. In particular, the operation of latch unit 510 is first described for a case where the semiconductor memory device is powered-up. Where the semiconductor memory device is powered-up, power-up signal PVCCH transitions from logic level "low" to logic level "high" and reset signal RESET assumes logic level "high". Reset signal RESET turns on a transistor in inverter 512, causing an output of inverter 512 to assume logic level "low". Latch 514 receives and latches the output of inverter 512. As a result, latch 514 stores a logical '0'.

Latch 514 outputs a latch data signal PREG, which has logic level "low" when latch 514 stores a logical '0'. Where latch data signal PREG has logic level "low", word line enable signal generation unit "i" outputs word line enable signal PNW<i> with logic level "low". As a result, a refresh operation is not performed on word line set WS<i> even if a word line refresh command is input to the corresponding word line enable signal generation unit 500.

Referring to FIG. 1, decoder 400 comprises a row address decoder circuit adapted to decode a signal received through input/output terminals of the semiconductor memory device. Decoder 400 outputs at least one row address decoding signal DRAij<i>, DRAkl<i>, DRAmn<i> or Pxi[<0>:<3>]. Decoder 400 may further comprise a predecoder.

According to one embodiment of the present invention, four word lines are included in each word line set WS<i>, and refresh operations are independently performed for each word line set WS<i>. Whether a refresh operation is performed on a particular word line set WS<i> depends on the value of latch data signal PREG corresponding to word line set. Where necessary, a separate latch and latch data signal PREG can be provided for each word line to control whether a refresh operation is performed on each individual word line.

Row address decoding signals DRAij<i>, DRAkl<i>, DRAmn<i> and Pxi[<0>:<3>] are used to both activate word line sets WS<i> and to identify word line sets WS<i> that require a refresh operation. Bits A1 and A0 in eight bit address A[7:0] are typically not just used to select among four word lines in word line set WS<i>. In addition, these bits may also be used to determine the voltage levels of row address decoding signals Pxi[<0>:<3>].

Various subsets of bits A2 through A7 are generally decoded to determine the respective logic levels of row address decoding signals DRAij<i> and DRAkl<i>. Row address decoding signals DRAij<i> and DRAkl<i> are used to determine whether word line block WLB(i) (or word line set WS<i>) requires a refresh operation. A subset of bits A2 through A7 that were not used to determine the logic levels of row address decoding signals DRAij<i> and DRAkl<i> are decoded to determine a logic level for row address decoding signal DRAmn<i>, which may be used to select a latch unit connected to a corresponding word line set WS<i>.

Where the semiconductor memory device receives an activation command, internal control signal generation unit 100 outputs activation command signal PACT with a logic level "high". Activation/refresh signal generation unit 200 then generates activation/refresh signal PACT_PREF with logic level "high" in response to the high logic level of activation command signal PACT. Next, decoder 400 operates to enable word line set WS<i>. Where activation/refresh signal PACT_PREF has logic level "high", word line enable signal generation unit "i" generates refresh decision signal PNWR with logic level "high".

Where activation/refresh signal PACT_PREF has logic level "high", it causes a corresponding latch 514 in word line enable signal generation unit "i" to store logical '1'. A logical '1' stored in latch 514 serves as an indication that a memory cell connected to a corresponding word line set has been accessed. Accordingly, the logic state stored in latch 514 is used to determine whether a refresh operation will be subsequently performed on the corresponding word line set.

Where latch 514 stores a logical '1', it outputs a latch data signal PREG with logic level "high". Latch data signal PREG is input to comparison unit 520, along with encoding address signals DRAij<i> and DRAkl<i>. As a result, word line set WS<i> corresponding to row address decoding signals DRAij<i> and DRAkl<i> is activated.

Activation/refresh signal PACT_PREF is input to a NOR gate in a word line enable signal generation units 500. The NOR gate is connected to other circuits described in relation to FIG. 4 so that where activation/refresh signal PACT_PREF has logic level "high", latch unit 510 outputs refresh decision signal PNWR<i> with logic level "high".

Activation/refresh signal PACT_PREF is input to a NAND gate in latch unit 510 and the output of the NAND gate is input to a PMOS transistor in inverter 512, so that when activation/refresh signal PACT_REF has logic level "low", the PMOS transistor is turned off. Where the PMOS transistor is turned on, it causes latch 514 to store logical '1', which is subsequently used to determine whether a refresh operation is performed on a corresponding word line set WS. Where latch 514 stores logical '1', the refresh operation is performed on word line set WS<i>.

Where the semiconductor memory device receives a refresh command, internal control signal generation unit 100 generates refresh command signal PREF with logic level "high". At the same time, activation/refresh signal PACT_PREF has logic level "low". At this time, decoder 400 operates to enable one of word line sets WS<i> using word line enable signal generation units 500. Even though activation/refresh signal PACT_PREF has logic level "low", since latch data signal PREG has logic level "high", latch unit 510 outputs refresh decision signal PNWR with logic level "high".

In contrast, where a refresh command is received but latch 514 stores a logical '0', data latch signal PREF has logic level "low", which causes refresh decision signal PNWR to also have logic level "low".

Comparison unit 520 typically comprises a NAND gate and an inverter. Comparison unit 520 receives row address decoding signals DRAij<i> and DRAkl<i> and a refresh decision signal PNWR, and outputs a word line enable signal PNWE<i> to word line set WS<i> in a corresponding word line block.

Word line driver 600 comprises a plurality of AND gates. Word line driver 600 receives signals Pxi[<0>:<3>] and word line enable signal PNWE<i> to select word lines in word line set WS<i>. Word line driver 600 applies power to the word lines to perform the refresh operation. As shown in FIG. 4, each AND gate may comprise a NAND gate connected to an inverter. Whether the refresh operation is performed depends on the logic level of word line enable signal PNWE<i>. For example, where word line enable signal PNWE<i> has logic level "high", the refresh operation is performed.

Figure 5:
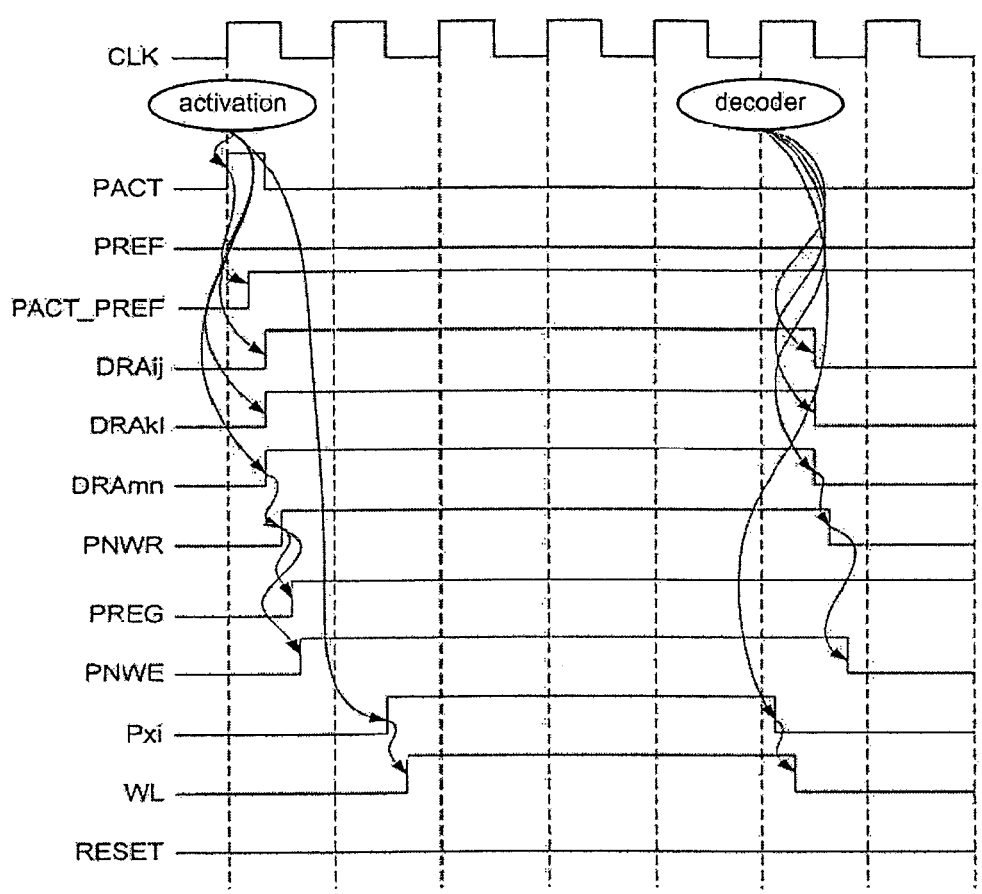
FIGS. 5 through 7 are waveform timing diagrams illustrating the operation of the word line enable signal generation unit shown in FIG. 4.
Figure 6:
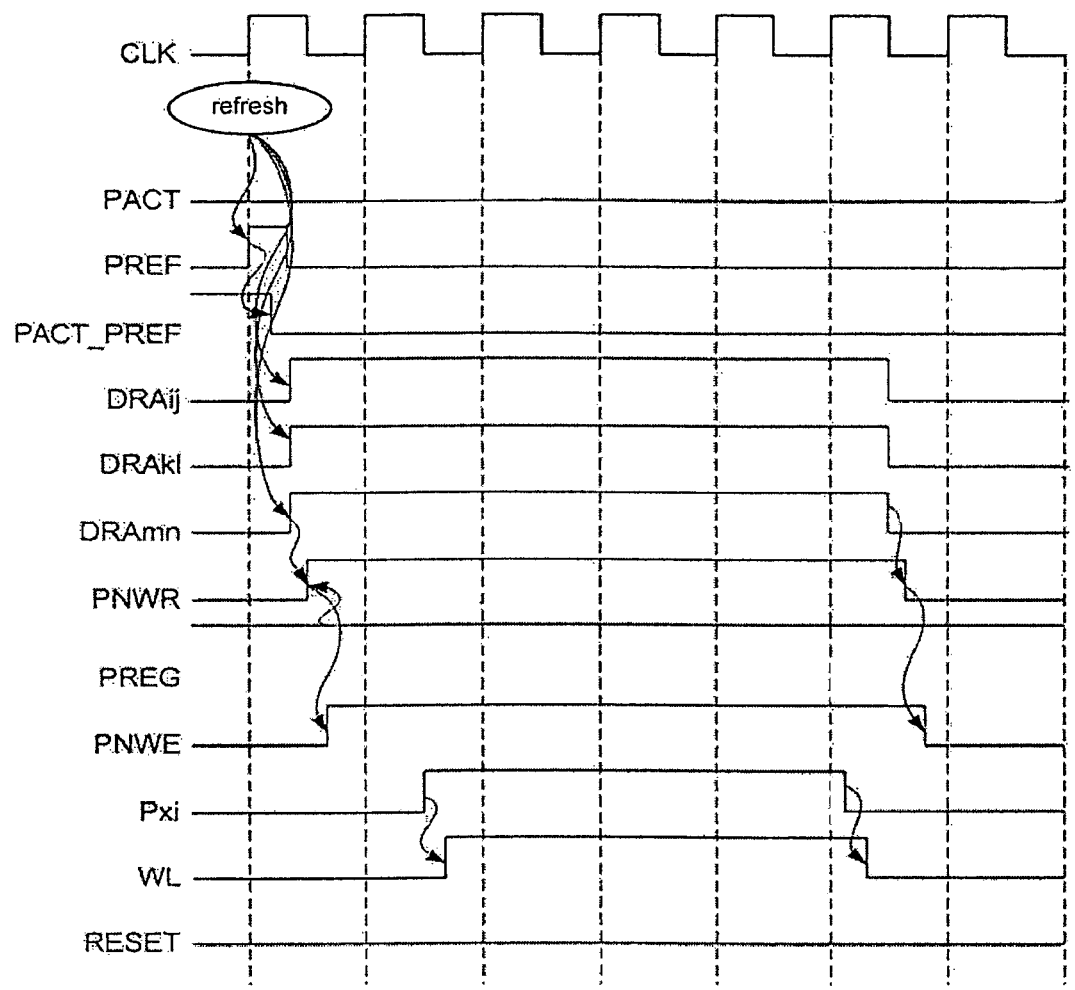
Figure 7:
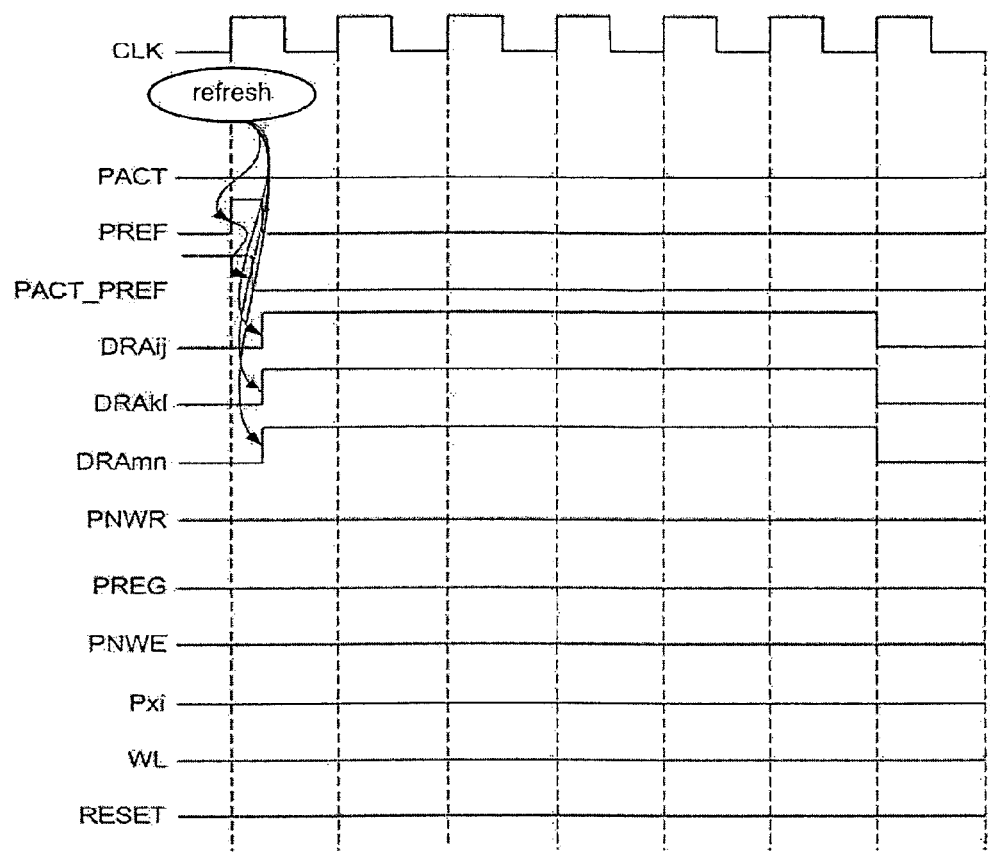

The operation of the semiconductor device shown in FIG. 1 is further illustrated by waveform timing diagrams shown in FIGS. 5 through 7. FIGS. 5 through 7 illustrate the operation of a single word line set WS<0>. However, the following description relating to FIGS. 5 through 7 also applies to other word line sets and blocks. Since the description may apply to all word lines, FIGS. 5 through 7 omit index labels, e.g., "<0>" in DRAij<0>, from the labels of respective signals.

FIG. 5 illustrates the operation of the semiconductor memory device after receiving an activation command. The semiconductor memory device receives the activation command from an external source, and internal control signal generation unit 100 generates activation command signal PACT as a pulse signal with logic level "high" in response to the activation command.

Activation/refresh signal generation unit 200 in refresh control unit 150 receives the pulse signal and then activates activation/refresh signal PACT_PREF. After internal control signal generation unit 100 generates activation command signal PACT as the pulse signal, decoder 400 decodes row address ADDR and activates row address decoding signals DRAij<0>, DRAkl<0>, and DRAmn<0>. Consequently, word line set WS<0> is enabled.

Word line enable signal generation unit 500 receives row address decoding signals DRAmn<0>, DRAij<0>, and DRAkl<0>, and activation/refresh signal PACT_PREF, and stores a logical '1' in latch 514 of latch unit 510. As a result, latch data signal PREG is activated. Storing a logical '1' in latch 514 causes latch unit 510 to activate refresh decision signal PNWR<0>, causing word line set WS<0> to be refreshed.

Latch data signal PREG and activation/refresh signal PACT_PREF are input to a NOR gate in latch unit 510. The NOR gate outputs a signal which is inverted and then input to a NAND gate along with row address decoding signal DRAmn<0>. The NAND gate produces an output which is inverted to produce refresh decision signal PNWR<0>. Since row address refresh decoding signal DRAmn<0>, latch data signal PREG, and activation/refresh signal PACT_PREF are all activated, refresh decision signal PNWR<0> has the logic level "high".

Refresh decision signal PNWR<0> and row address decoding signals DRAij<0> and DRAkl<0> are input to comparison unit 520 so that comparison unit 520 outputs word line enable signal PNWE<0> with logic level "high". Word line enable signal PNWE<0> and signals Pxi<0> through Pxi<3> are input to respective AND gates of word line driver 600 to activate one or more of word lines WL<0> through WL<3>. Data is then stored in memory cells connected to the one or more activated word lines. Finally, decoder 400 inverts and outputs row address decoding signals DRAmn<0>, DRAij<0>, and DRAkl<0> so that word line set WS<0> is no longer activated.

FIG. 6 is a waveform timing diagram illustrating a refresh operation of the semiconductor memory device. For explanation purposes, it will be assumed that in the refresh operation, word line set WS<0> is activated and that at least one memory cell connected to word lines WL<0> through WL<3> of word line set WS<0> stores a logical '1'. Accordingly, latch data signal PREG is activated.

The refresh operation is initiated when internal control signal generation unit 100 receives an external refresh command signal. When the refresh operation is initiated, refresh command signal PREF transitions to logic level "high", and then activation/refresh signal PACT_PREF transitions from logic level "high" to logic level "low".

Next, decoder 400 receives address ADDR, and outputs decoded row address decoding signals DRAmn<0>, DRAij<0> and DRAkl<0> to enable a corresponding row address. Since latch data signal PREG is activated, refresh decision signal PNWR transitions to logic level "high" to cause a refresh operation to be performed on a corresponding word line.

FIG. 7 is a waveform timing diagram illustrating a refresh operation of the semiconductor memory device under different conditions than those illustrated in relation to FIG. 6. In particular, in FIG. 7, it is assumed that word line set WS<0> corresponds to word line block WLB<0>, which has not been accessed and therefore memory cells connected to word line set WS<0> do not store any logical '1's. In other words, all of the memory cells connected to word line set WS<0> store "low-level data". Accordingly latch data signal PREG is deactivated (i.e., has logic level "low").

Internal control signal generation unit 100 generates refresh command signal PREF with logic level "high" in response to the external refresh command. Refresh command signal PREF is input to activation/refresh signal generation unit 200, which outputs activation/refresh signal PACT_PREF with logic level "low".

Next, decoder 400 receives address ADDR and outputs decoded row address decoding signal DRAmn<0>, DRAij<0> and DRAkl<0> with logic level "high" to enable a corresponding row address. However, latch 514 stores a logical '0', and therefore latch data signal PREG is deactivated. Since latch data signal PREG has logic level "low" and activation/refresh signal PACT_PREF also has logic level "low", refresh decision signal PNWR<0> assumes logic level "low", and therefore word line enable signal PNWE<0> is output from comparison unit 520 with logic level "low". As a result, a refresh operation is not performed on the word line.

FIGS. 8 through 11 are block diagrams conceptually illustrating the semiconductor memory device shown in FIG. 1. The semiconductor memory device contains four (4) banks labeled Bank "A", Bank "B", Bank "C" and Bank "D". In each of the memory banks, word lines are illustrated conceptually by vertical lines, and a logical '1' stored in a memory cell connected to the word line is illustrated by a circle. Each bank contains eight (8) word lines, making a total of 32 word lines between the four banks. In a conventional semiconductor memory device, 32 refresh operations would be required to refresh the 32 word lines in each refresh cycle. However, the semiconductor memory device shown in FIG. 1 may require less refresh operations.

Figure 8:
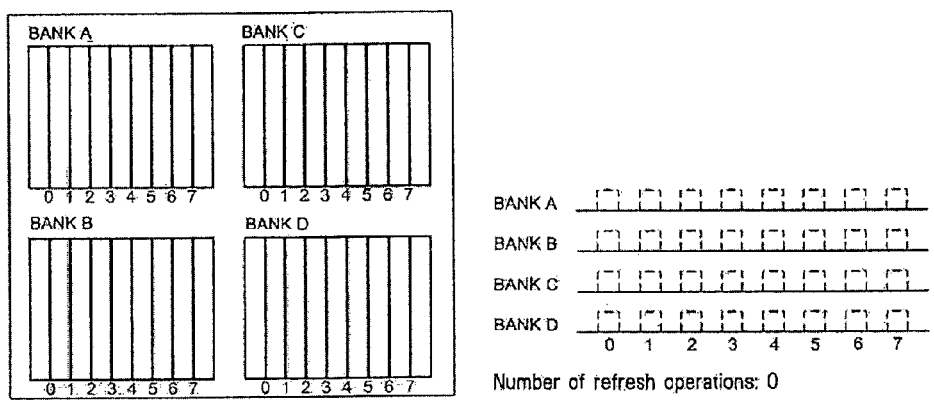
FIGS. 8 through 11 are conceptual diagrams of memory cell arrays shown in the semiconductor memory device of FIG. 1.

In FIG. 8, none of the banks stores a logical '1'. Accordingly the semiconductor memory device does not perform any refresh operations.

Figure 9:
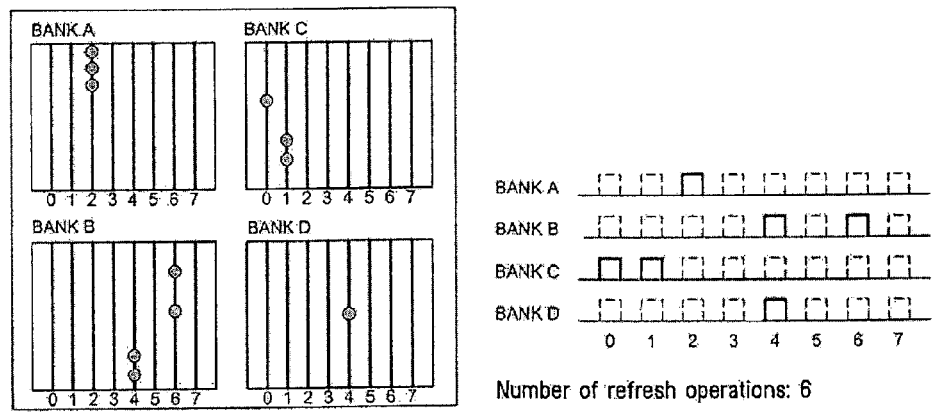

In FIG. 9, Bank "A" stores logical '1's in relation to a corresponding word line 2, Bank "B" stores logical '1's in relation to corresponding word lines 4 and 6, Bank "C" stores logical '1's in relation to corresponding word lines 0 and 1, and Bank "D" stores a logical '1' in relation to a corresponding word line 4. Refresh operations are only required for those word lines that store data, and therefore only six (6) refresh operations are performed.

Figure 10:
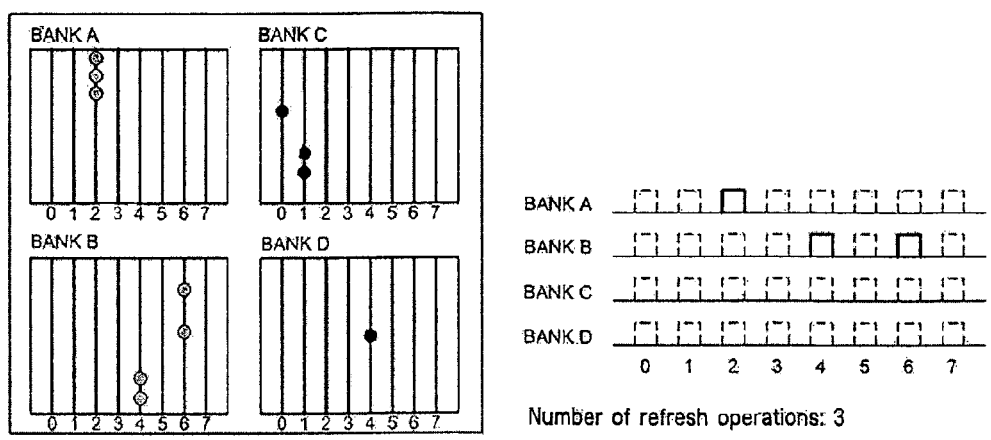

In FIG. 10, Banks "A" through "D" store the same data as in FIG. 9. However, in FIG. 10, the semiconductor memory device only uses Banks "A" and "B". By using the "PASR HALF MRS" mode, Banks "C" and "D" are not refreshed, and therefore their data is lost. On the other hand, word line 2 of Bank "A" and word lines 4 and 6 of bank "B" store logical '1's, and therefore the semiconductor memory device performs three (3) refresh operations in the refresh cycle.

Figure 11:
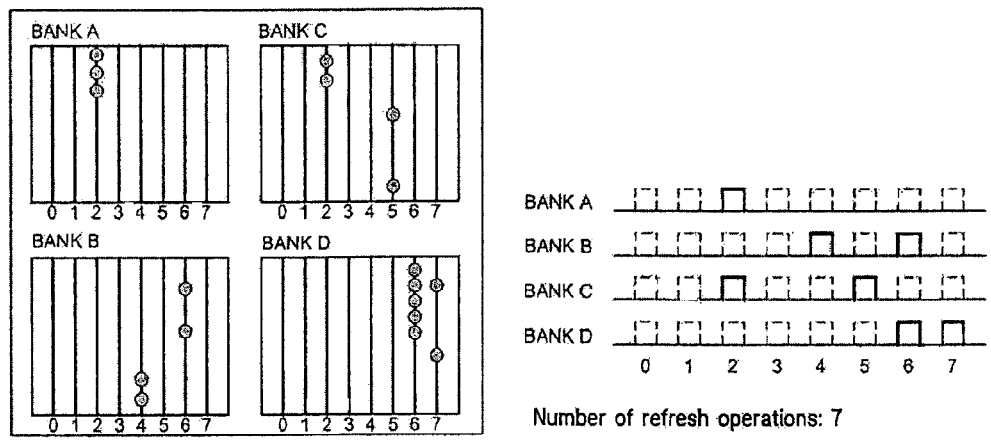

In FIG. 11, Bank "A" stores logical '1's in relation to a corresponding word line 2 and Bank "B" stores logical '1's in relation to corresponding word lines 4 and 6. Banks "C" and "D" are accessed to store logical '1's in memory cells corresponding word lines 2 and 5, and 6 and 7, respectively. In other words, FIG. 11 differs from FIG. 10 in that data stored in banks A and B is preserved because banks A and B have been refreshed, but data previously stored in banks C and D is lost and new data is written in these banks.

According to selected embodiments of the present invention, refresh operations can be performed only on word lines of a semiconductor memory device where data is stored, thereby reducing a refresh cycle time and overall power consumption of the device.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor memory device comprising:
a memory cell array comprising a plurality of memory cells connected to a plurality of word lines and a plurality of bit lines arranged in a matrix, wherein the word lines are divided into a plurality of word line sets, wherein each word line set comprises at least one word line, wherein the word line sets are divided into a first group of word line sets and a second group of word line sets, and wherein the first and second groups of word line sets each comprise more than one of the word line sets; and,
a refresh control unit comprising:
a first word line enable signal generation unit corresponding to a first word line set of the plurality of word line sets, wherein the first word line enable signal generation unit comprises a latch unit storing either a first or a second data value, and prevents the first word line set from being refreshed only when the latch unit stores the first data value; and,
a reset signal generation unit receiving a mode register set (MRS) signal, a word line set address signal, and a power-up signal, wherein, when the received word line address signal corresponds to the first word line set, the reset signal generation unit selectively provides an activated reset signal to the latch unit in accordance with the received MRS signal, the received word line address signal, and the received power-up signal,
wherein the latch unit either begins or continues to store the first data value in response to receiving the activated reset signal, and
wherein, when the MRS signal indicates an MRS mode, the refresh control unit allows selected word line sets in the first group of word line sets to be refreshed, while preventing every word line set in the second group of word line sets from being refreshed.

2. The semiconductor memory device of claim 1, further comprising an internal control signal generation unit outputting the MRS signal.

3. The semiconductor memory device of claim 1, wherein the power-up signal is activated when the device is powered up.

4. The semiconductor memory device of claim 1, wherein the refresh control unit further comprises a plurality of word line enable signal generation units, and wherein the plurality of word line enable signal generation units comprises the first word line enable signal generation unit.

5. The semiconductor memory device of claim 4, wherein each of the word line enable signal generation units corresponds to one of the word line sets.

6. The semiconductor memory device of claim 1, wherein the latch unit outputs a refresh decision signal having a logic level corresponding to the data value stored in the latch unit.

7. The semiconductor memory device of claim 1, wherein the first data value is a logical "0".

8. The semiconductor memory device of claim 1, wherein the first word line enable signal generation unit generates a word line enable signal having a first logic level when the latch unit stores the first data value.

9. The semiconductor memory device of claim 8, wherein the first logic level is a logic level "low".

* * * * *